United States Patent
Shi et al.

(10) Patent No.: US 11,171,036 B2
(45) Date of Patent: Nov. 9, 2021

(54) PREVENTING DIELECTRIC VOID OVER TRENCH ISOLATION REGION

(71) Applicant: GLOBALFOUNDRIES U.S. Inc., Santa Clara, CA (US)

(72) Inventors: Yongjun Shi, Clifton Park, NY (US); Wei Hong, Clifton Park, NY (US); Chun Yu Wong, Clifton Park, NY (US); Halting Wang, Clifton Park, NY (US); Liu Jiang, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 169 days.

(21) Appl. No.: 16/596,814

(22) Filed: Oct. 9, 2019

(65) Prior Publication Data

US 2021/0111065 A1  Apr. 15, 2021

(51) Int. Cl.
*H01L 21/762* (2006.01)
*H01L 27/12* (2006.01)

(52) U.S. Cl.
CPC .... *H01L 21/76243* (2013.01); *H01L 27/1203* (2013.01)

(58) Field of Classification Search
CPC ....... H01L 2924/00; H01L 2924/00015; H01L 2224/32225; H01L 2224/48227; H01L 2224/73265; H01L 2924/00014; H01L 2224/32145; H01L 2224/73204; H01L 2924/0002; H01L 2224/16145; H01L 2224/45124; H01L 2224/45147; H01L 2224/48091; H01L 2224/73253; H01L 2924/00011; H01L 2924/01033; H01L 2924/0132; H01L 2924/10253; H01L 2924/12032; H01L 2924/12036; H01L 2924/12042; H01L 2924/1301; H01L 2924/1305; H01L 2924/1306; H01L 2924/13062; H01L 2924/14; H01L 2924/15311; H01L 2924/15788; H01L 2924/16152; H01L 2924/181; H01L 21/8221; H01L 21/823828; H01L 21/84; H01L 21/845; H01L 2224/05599;
(Continued)

(56) References Cited

U.S. PATENT DOCUMENTS

8,765,491 B2    7/2014 Cai et al.
2006/0154491 A1*  7/2006 Xie .................. C23C 16/45523
                                                    438/760
(Continued)

*Primary Examiner* — Telly D Green
(74) *Attorney, Agent, or Firm* — Anthony Canale; Hoffman Warnick LLC (57) ABSTRACT

A method and related structure provide a void-free dielectric over trench isolation region in an FDSOI substrate. The structure may include a first transistor including a first active gate over the substrate, a second transistor including a second active gate over the substrate, a first liner extending over the first transistor, and a second, different liner extending over the second transistor. A trench isolation region electrically isolates the first transistor from the second transistor. The trench isolation region includes a trench isolation extending into the FDSOI substrate and an inactive gate over the trench isolation. A dielectric extends over the inactive gate and in direct contact with an upper surface of the trench isolation region. The dielectric is void-free, and the liners do not extend over the trench isolation.

15 Claims, 5 Drawing Sheets

(58) Field of Classification Search
CPC . H01L 2224/16225; H01L 2224/80001; H01L 25/0657; H01L 27/0688; H01L 27/092; H01L 27/10802; H01L 27/1108; H01L 27/1203; H01L 2924/00012; H01L 2924/01031; H01L 2924/3512; H01L 29/66795; H01L 21/26586; H01L 21/266; H01L 21/28026; H01L 21/28105; H01L 21/6835; H01L 21/76243; H01L 21/76254; H01L 21/823814; H01L 21/823821; H01L 21/823842; H01L 21/823864; H01L 21/823871; H01L 21/823878; H01L 2221/68368; H01L 2223/5442; H01L 2223/54426; H01L 2224/0401; H01L 2224/16235; H01L 2224/83894; H01L 2225/06513; H01L 2225/06541; H01L 23/3677; H01L 23/481; H01L 23/5252; H01L 23/528; H01L 24/05; H01L 24/13; H01L 24/32; H01L 24/45; H01L 24/48; H01L 24/83; H01L 25/0655; H01L 25/50; H01L 27/0207; H01L 27/0694; H01L 27/0924; H01L 27/10; H01L 27/105; H01L 27/10873; H01L 27/10876; H01L 27/10894; H01L 27/10897; H01L 27/11; H01L 27/1104; H01L 27/1116; H01L 27/112; H01L 27/11206; H01L 27/11213; H01L 27/11526; H01L 27/11529; H01L 27/11551; H01L 27/11573; H01L 27/11578; H01L 27/11807; H01L 27/11898; H01L 27/1211; H01L 27/1214; H01L 27/1266; H01L 27/2436; H01L 27/249; H01L 2924/01002; H01L 2924/01004; H01L 2924/01005; H01L 2924/01006; H01L 2924/01013; H01L 2924/01018; H01L 2924/01019; H01L 2924/01023; H01L 2924/01029; H01L 2924/01046; H01L 2924/0105; H01L 2924/01051; H01L 2924/01066; H01L 2924/01068; H01L 2924/01072; H01L 2924/01073; H01L 2924/01074; H01L 2924/01075; H01L 2924/01076; H01L 2924/01077; H01L 2924/01078; H01L 2924/01082; H01L 2924/01322; H01L 2924/014; H01L 2924/10329; H01L 2924/13091; H01L 2924/1579; H01L 2924/19041; H01L 2924/30105; H01L 2924/3011; H01L 2924/3025; H01L 29/0649; H01L 29/0673; H01L 29/161; H01L 29/4232; H01L 29/4236; H01L 29/42392; H01L 29/4908; H01L 29/4983; H01L 29/66272; H01L 29/66439; H01L 29/66545; H01L 29/66621; H01L 29/66772; H01L 29/66825; H01L 29/66833; H01L 29/66901; H01L 29/775; H01L 29/78; H01L 29/7831; H01L 29/7838; H01L 29/7841; H01L 29/7849; H01L 29/785; H01L 29/7881; H01L 29/792; H01L 45/04; H01L 45/1226; H01L 45/146

See application file for complete search history.

(56) References Cited

U.S. PATENT DOCUMENTS

2008/0272492 A1   11/2008  Tsang
2010/0133620 A1*  6/2010  Richter ............... H01L 29/7833
                                                                   257/368

* cited by examiner

PREVENTING DIELECTRIC VOID OVER TRENCH ISOLATION REGION

BACKGROUND

The present disclosure relates to integrated circuit (IC) fabrication, and more specifically, to a method for preventing void formation in a dielectric over a trench isolation region by removing liners thereover.

Advanced manufacturing of ICs requires formation of individual circuit elements, e.g., field-effect-transistors (FETs) and the like, based on specific circuit designs. A FET generally includes source, drain, and gate regions formed over a substrate. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Trench isolations include a trench etched into the substrate and filled with an insulating material to isolate one region of the substrate from an adjacent region of the substrate. One or more transistors of a given polarity may be disposed within an area isolated by the trench isolation. A dielectric is formed over the transistors and the trench isolation. Electrical contacts to various structures of the transistors, e.g., source/drain regions, may be formed through the dielectric.

Dielectric formation in current technology nodes in certain areas can be challenging. For example, in fully depleted semiconductor-on-insulator (FDSOI) technologies, transistors are formed in such close proximity that formation of the dielectric over the trench isolation between the transistors without a void therein is very difficult. Void-free dielectric formation is also made more difficult because the stress liners of the transistors restrict the space over the trench isolation into which the dielectric forms. In addition, the trench isolation has an ever smaller step height, further limiting the available space for the dielectric. A void creates an unintended opening into which a contact conductor (e.g., tungsten) may extend, resulting in a short, e.g., between adjacent source/drain contacts. Current approaches provide a liner layer to prevent void formation, which adds complexity to subsequent contact etching processes.

SUMMARY

A first aspect of the disclosure is directed to a method, comprising: over a trench isolation region between a first active gate having a first liner thereover and a second active gate including a second, different liner thereover, wherein the trench isolation region includes an inactive gate over a trench isolation and the first and second liners over at least a part of the trench isolation region: removing the first liner and the second liner from over the trench isolation region; and forming a dielectric over at least the trench isolation region, the dielectric contacting an upper surface of the trench isolation, wherein the dielectric is void-free.

A second aspect of the disclosure includes a structure, comprising: a substrate; a first transistor including a first active gate over the substrate; a second transistor including a second active gate over the substrate; a first liner extending over the first transistor; a second, different liner extending over the second transistor; a trench isolation region electrically isolating the first transistor from the second transistor, the trench isolation region including a trench isolation extending into the substrate and an inactive gate over the trench isolation; and a dielectric extending over the inactive gate and in direct contact with an upper surface of the trench isolation, wherein the dielectric is void-free and an end of each of the first and second liners does not extend over the trench isolation in the trench isolation region.

A third aspect of the disclosure related to a fully depleted semiconductor-on-insulator (FDSOI) structure, comprising: an FDSOI substrate; a first transistor including a first active gate over a semiconductor-on-insulator (SOI) layer of the FDSOI substrate; a second transistor including a second active gate over the SOI layer of the FDSOI substrate; a first liner extending over the first transistor; a second liner extending over the second transistor; a trench isolation region electrically isolating the first transistor from the second transistor, the trench isolation region including a trench isolation extending into the FDSOI substrate and an inactive gate over a plateau of the trench isolation; and an interlayer dielectric (ILD) extending over the inactive gate and in direct contact with an upper surface of the trench isolation adjacent the plateau of the trench isolation wherein the dielectric is void-free and an end of each of the first and second liners does not extend over the trench isolation in the trench isolation region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a method and resulting structure having a void-less dielectric over a trench isolation region. The disclosure is applicable to all substrates, and particularly advantageous in a fully depleted semiconductor-on-insulator (FDSOI) technology. The method removes the liners, e.g., compressive and tensile stress liners that may extend over an inactive gate in the trench isolation region to provide space for a dielectric formed over the trench isolation region. In this fashion, the dielectric forms without a void, and in contact with the inactive gate, a side of a plateau of the isolation region and an upper surface of the trench isolation adjacent the plateau. The liners do not extend over the trench isolation.

Figure 1:
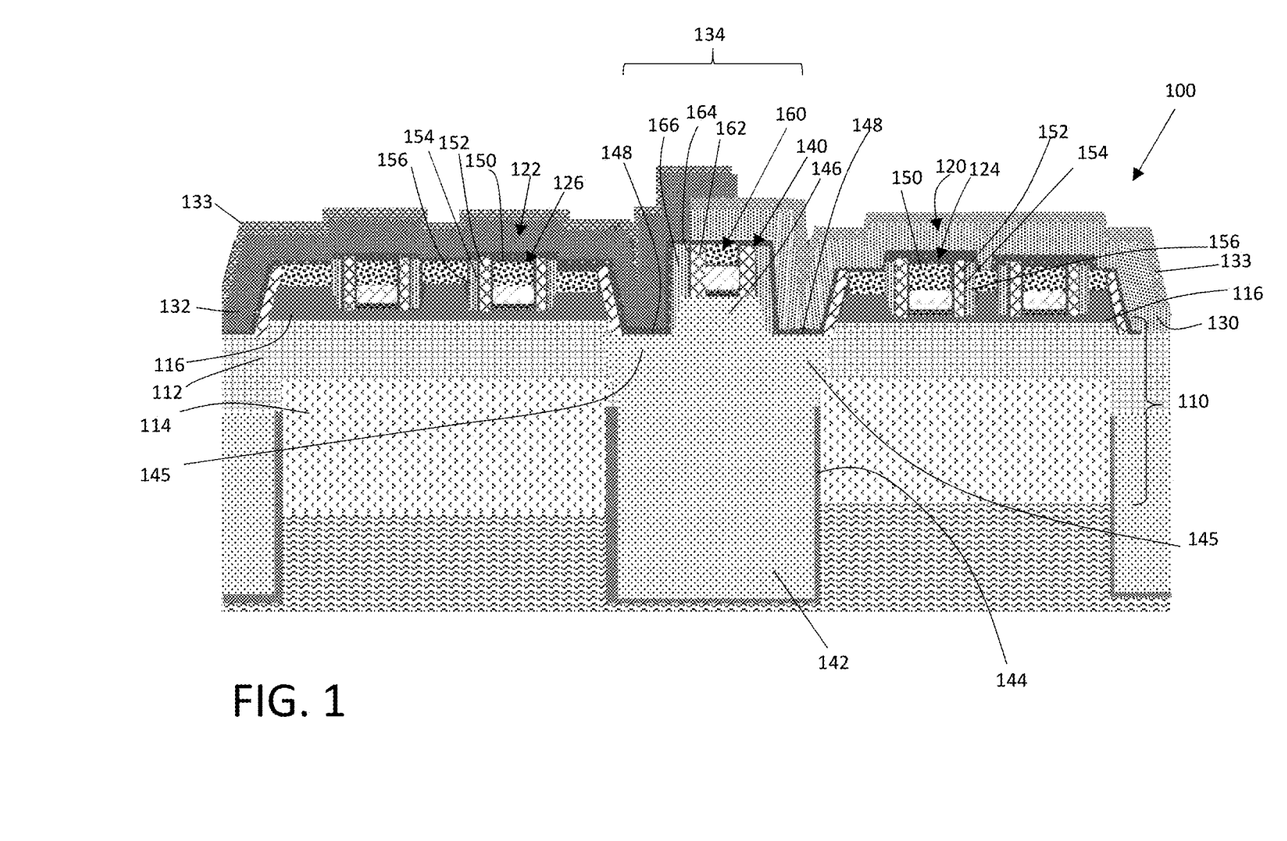
FIG. 1 shows a cross-sectional view of a preliminary structure, according to embodiments of the disclosure.

FIG. 1 shows a cross-sectional view of a preliminary structure 100 upon which embodiments of a method according to the disclosure may be applied. Preliminary structure 100 includes, for example, a fully depleted semiconductor-on-insulator (FDSOI) substrate 110. FDSOI substrate 110 includes an ultra-thin (e.g., thickness of twenty-five nanometers or less) layer of insulator 112, called the buried insulator layer or buried oxide (BOX), positioned on top of a base semiconductor substrate 114, and a very thin (e.g., thickness of twelve nanometers or less) semiconductor-on-insulator (SOI) layer 116 over buried insulator layer 112 that provides a channel for first and second transistors 120, 122. The ultra-thin SOI layer 116 does not need to be doped to create the channel, thus making the transistor "fully depleted." FDSOI substrates 110 provide better transistor electrostatic characteristics compared to bulk semiconductor technology, and buried insulator layer 112 lowers the parasitic capacitance between the drain and source of transistors 120, 122, and confines the electrons flowing from the source to the drain, reducing leakage currents that damage performance.

Transistors 120, 122 may include any now known or later developed transistor structure. In one non-limiting example, each transistor 120, 122 may include a fin-type field effect transistor (finFET), i.e., using fins (not shown) in SOI layer 116. For purposes of description, first transistor 120 may include an n-type FET and second transistor 122 may include a p-type FET. It is understood that their locations may be switched. First transistor 120 also includes a first active gate 124 over FDSOI substrate 110, i.e., over SOI layer 116, and second transistor 122 includes a second active gate 126 over FDSOI substrate 110. Source/drain regions (not labeled) are located in SOI layer 116 in a known fashion.

Liners may be applied over FETs for a number of reasons. In one example, the application of particular stress liners to FETs is known to improve their performance. When applied in a longitudinal direction (i.e., in the direction of current flow), tensile stress is known to enhance electron mobility (or nFET drive currents) while compressive stress is known to enhance hole mobility (or pFET drive currents). One way to apply such stresses to a FET is the use of intrinsically-stressed barrier silicon nitride liners (hereinafter "liners"). Liners may also be provided to protect other structure. In any event, a first liner 130 may extend over first transistor 120, and a second, different liner 132 may extend over second transistor 122. Where the liners are to impart a stress, first liner 130 may include a tensile stress liner to cause tension in an nFET channel of first transistor 120, while second stress liner 132 may include a compressive stress liner to cause compression in a pFET channel of second transistor 122. The use of two liners is referred to as a dual/hybrid liner scheme, and is common to induce the desired stresses in adjacent nFETs 120 and pFETs 122. Each liner 130, 132 is shown with a cap layer 133 thereover.

FDSOI substrate 110 and first and second transistors 120, 122 may be formed using any now known or later developed semiconductor fabrication techniques. Liners 130, 132 may be formed using any now known or later developed semiconductor fabrication techniques, e.g., deposition of first liner 130 over both transistors 120, 122, removal of first liner 130 from over second transistor 122, deposition of second liner 132 over both transistors 120, 122, and then removal of second liner 132 from over first liner 130 over first transistor 120.

Regardless of how liners 130, 132 are formed, in preliminary structure 100, liners 130, 132 extend over at least a part of a trench isolation region 134 that electrically isolates adjacent nFETs 120 and pFETs 122. Trench isolation region 134 is between first active gate 124 having first liner 130 thereover, and second active gate 126 including second, different liner 132 thereover. Trench isolation region 134 may include an inactive gate 140 over a trench isolation 142. Generally, trench isolation region 134 may be formed by etching a trench 144 into FDSOI substrate 110 and filling trench 144 with an insulating material such as oxide, to isolate one region of FDSOI substrate 110 from an adjacent region of the substrate. Thus, trench isolation 142 extends through FDSOI substrate 110. As noted, one or more transistors 120, 122 of a given polarity may be disposed within an area isolated by trench isolation region 134. Each trench isolation 142 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. Trench isolation 142 may include an upper portion 145 that is contiguous with insulator layer 112 of FDSOI substrate 110. Insulator layer 112 and trench isolation 142 may be made of the same or similar insulator materials, e.g., oxide.

In one non-limiting example, inactive gate 140 may be formed on a plateau or step 146 of trench isolation 142, e.g., a stepped area extending above the rest of an upper surface 148 of trench isolation 142. As illustrated, in preliminary structure 100, liners 130, 132 contact upper surface 148 of trench isolation 142 and fill much of the space between inactive gate 140 and active gates 124, 126 of first and second transistors 120, 122, respectively. As noted, when a dielectric (not shown) is formed over this structure, the space is oftentimes insufficient for it to form without creating a void (not shown). The void may later create an opening for a contact conductor extending adjacent thereto to the source/drain regions of the first and second transistors 120, 122, to electrically short.

With continuing reference to FIG. 1, each active gate 124, 126 includes a gate stack 150, an inner spacer 152 adjacent gate stack 150, a low-dielectric constant (low-K) layer 154 adjacent inner spacer 152, and an outer spacer 156 adjacent low-K layer 154. Similarly, in preliminary structure 100, inactive gate 140 includes a gate stack 160, an inner spacer 162 adjacent gate stack 160, a low-dielectric constant (low-K) layer 164 adjacent inner spacer 162, and an outer spacer 166 adjacent low-K layer 164. Active and inactive gates 124, 126, 140 may be formed together using any now known or later developed semiconductor fabrication techniques, i.e., prior to formation of liners 130, 132 thereover. As will be described, inactive gate 140 eventually has a different structure than active gates 124, 126.

Figure 2:
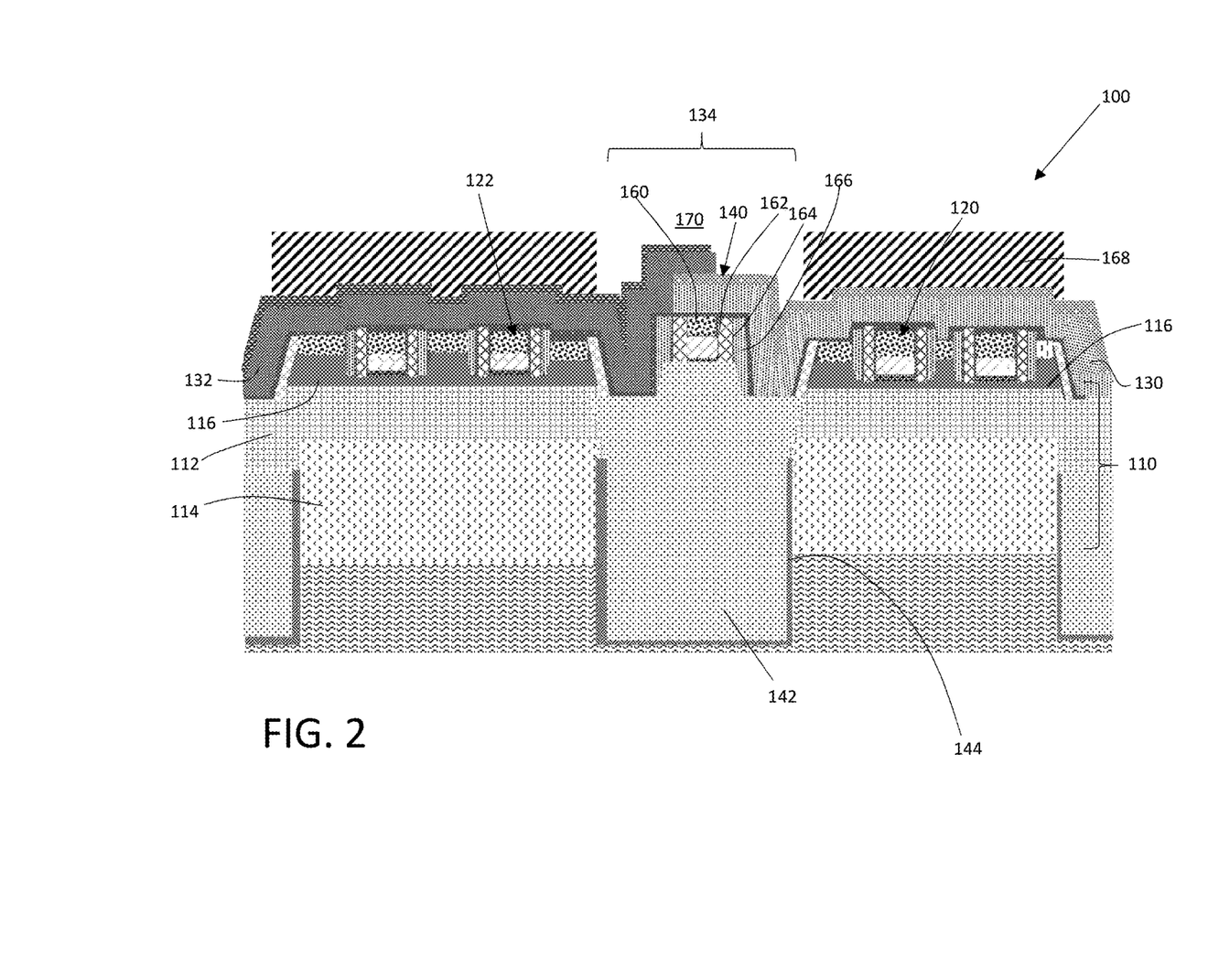
FIG. 2 shows a cross-sectional view of forming a mask with an opening exposing a trench isolation region, according to embodiments of the disclosure.

Referring to the cross-sectional view of FIG. 2, in accordance with embodiments of the disclosure, a method may include removing first liner 130 and second liner 132 from over trench isolation region 134. This process may include forming a mask 168 including an opening 170 exposing trench isolation region 134. The term "mask" may be given to a layer of material which is applied over an underlying layer of material, and patterned to have openings 170, so that the underlying layer can be processed where there are openings. After processing the underlying layer, the mask may be removed. Common masking materials are photoresist (resist) and nitride. Nitride is usually considered to be a "hard mask." Mask 168 may include, for example, a developable organic planarization layer (OPL) on the layer to be etched, a developable anti-reflective coating (ARC) layer on the developable OPL, and a photoresist mask layer on the developable ARC layer.

Figure 3:
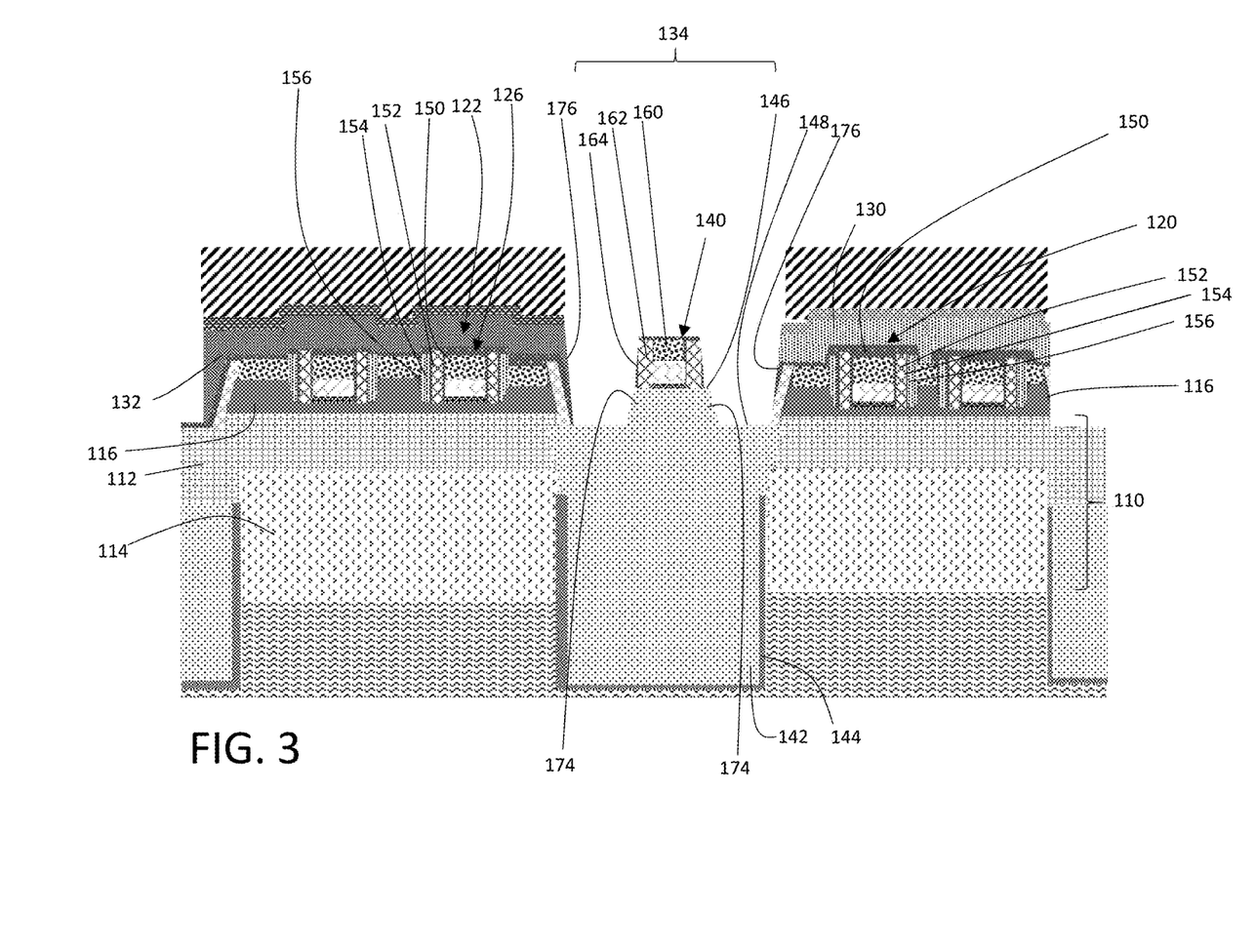
FIG. 3 shows a cross-sectional view of etching to remove liners over the trench isolation region, according to embodiments of the disclosure.

FIG. 3 shows a cross-sectional view of etching to remove first liner 130 and second liner 132, i.e., from trench isolation region 134. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as trench 144. In this case, the etching may include, for example, a RIE. During etching, outer spacer 166 (FIG. 1) of inactive gate 140 is removed, and at least a portion of low-K layer 164 may be removed from inactive gate 140. FIG. 3 shows at least a portion of low-K layer 164 remaining on inner spacer 162 of inactive gate 140. An upper surface 148 of trench isolation 142 and sides 174 of plateau 146 are also exposed by the etching. The etching may also expose ends 176 of first and second liners 130, 132.

Figure 4:
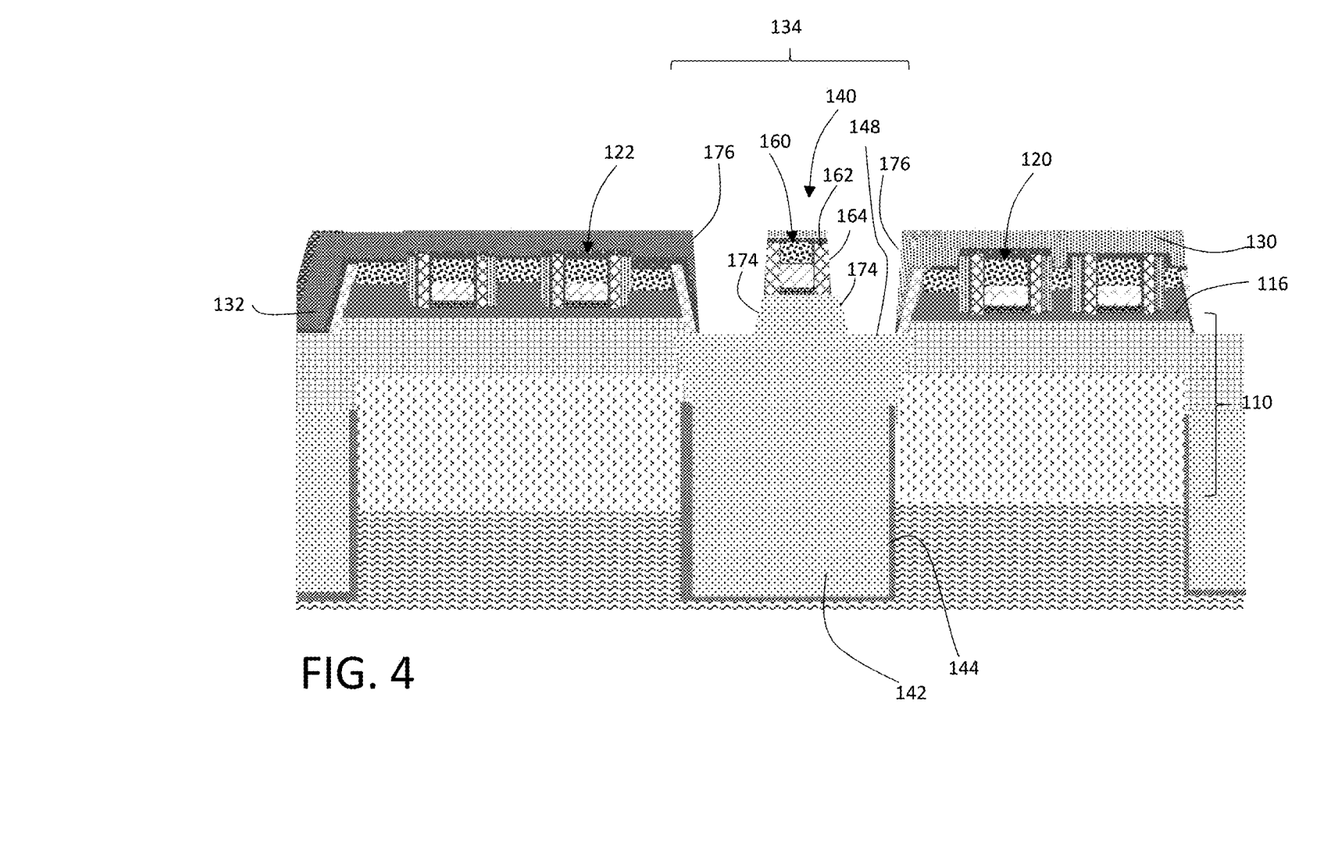
FIG. 4 shows a cross-sectional view of removing the mask, according to embodiments of the disclosure.

FIG. 4 shows a cross-sectional view of removing mask 168, e.g., using any now known or later developed stripping process appropriate for mask 168.

Figure 5:
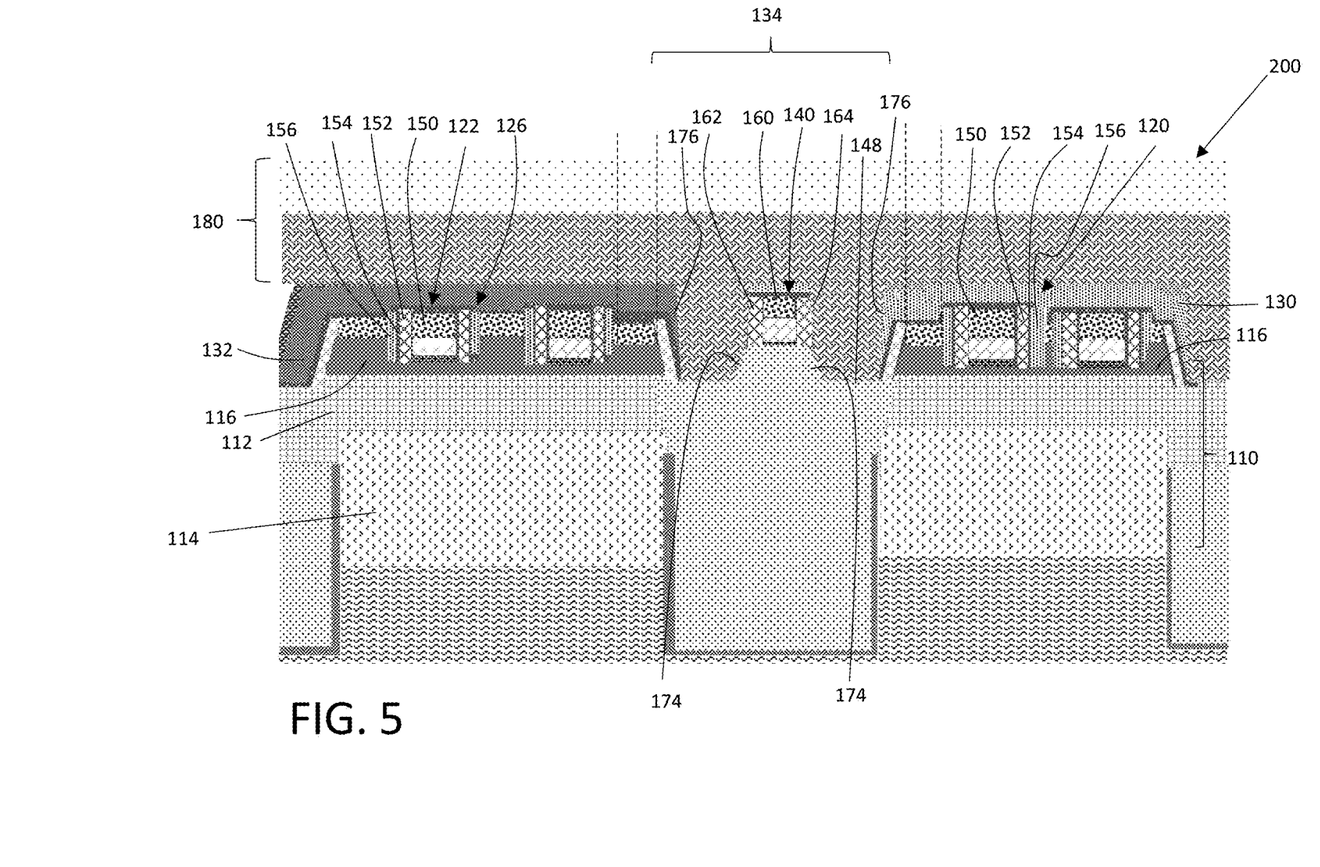
FIG. 5 shows a cross-sectional view of forming a dielectric to complete a structure, according to embodiments of the disclosure.

FIG. 5 shows a cross-sectional view of forming a dielectric 180 over at least trench isolation region 134. As shown, dielectric 180 may be over all of the structure including first and second transistors 120, 122. Dielectric 180 may include any suitable dielectric materials for an interlayer dielectric including but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one non-limiting example, dielectric 180 includes oxide. Dielectric 180 may be deposited in one layer or as layers of material. The "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As shown in FIG. 5, in contrast to conventional structures, dielectric 180 contacts upper surface 148 of trench isolation 142, not liners 130, 132 (FIG. 1). Notably, dielectric 180 is void-free because the removal of liners 130, 132 provides sufficient space for it to be formed without forming voids therein.

FIG. 5 also shows a cross-sectional view of a structure 200, e.g., an FDSOI structure, according to embodiments of the disclosure. Structure 200 includes FDSOI substrate 110, first transistor 120 (e.g., nFET) including first active gate 124 over the FDSOI substrate; second transistor 122 (e.g., pFET) including second active gate 126 over the FDSOI substrate. Each active gate 124, 126 includes gate stack 150, inner spacer 152 adjacent gate stack 150, low-K layer 154 adjacent inner spacer 152, and outer spacer 156 adjacent low-K layer 154. Structure 200 includes first liner 130 (e.g., a tensile stress liner or other liner) extending over first transistor 120, and second, different liner 132 (e.g., a compressive stress liner or other liner) extending over second transistor 122.

Structure 200 also includes trench isolation region 134 electrically isolating first transistor 120 from second transistor 122. Trench isolation region 134 includes trench isolation 142 extending into FDSOI substrate 110 and inactive gate 140 over trench isolation 142. Inactive gate 140 may be positioned on plateau 146 (where provided) of trench isolation 142. In contrast to active gates 124, 126, inactive gate 140 does not include outer spacer 166 (FIG. 2), which was removed when liners 130, 132 were removed from trench isolation region 134. Consequently, inactive gate 140 includes only: gate stack 160, inner spacer 162 adjacent gate stack 160, and low-K layer 164 adjacent at least a portion of inner spacer 162.

Structure 200 also includes dielectric 180 extending over inactive gate 140 and in direct contact with upper surface 148 of trench isolation 142. Dielectric 180 may include, for example, one or more layers of an oxide. Dielectric 180 is void-free in trench isolation region 134. Due to their removal in trench isolation 134, an end 176 of each of the first and second liners 130, 132 does not extend over trench isolation 142 in trench isolation region 134. That is, dielectric 180 abuts end 176 of at least one of first liner 130 and second liner 132, i.e., depending on the shape of the ends. Dielectric 180 is also in direct contact with inactive gate 140, e.g., low-K layer 164 where/if present and/or inner spacer 162. Dielectric 180 is also in direct contact with side 174 of plateau 146 of trench isolation 142 and upper surface 148 of trench isolation 142 adjacent plateau 146. As understood in the field, dielectric 180 may provide an interlayer dielectric (ILD) through which contacts (examples shown by dashed lines) are subsequently formed to source/drain regions of transistors 120, 122. Dielectric 180 may extend over first and second liners 130, 132 outside of trench isolation region 134.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a fully depleted semiconductor-on-insulator (FDSOI) substrate;
   a first transistor including a first active gate over the FDSOI substrate;
   a second transistor including a second active gate over the FDSOI substrate;
   a first liner extending over the first transistor;
   a second, different liner extending over the second transistor;
   a trench isolation region electrically isolating the first transistor from the second transistor, the trench isolation region including a trench isolation extending into the FDSOI substrate and an inactive gate over the trench isolation; and
   a dielectric extending over the inactive gate and in direct contact with an upper surface of the trench isolation, wherein the dielectric is void-free and an end of each of the first and second liners does not extend over the trench isolation in the trench isolation region.

2. The structure of claim 1, wherein each active gate includes a first gate stack, a first inner spacer adjacent the first gate stack, a first low-dielectric constant (low-K) layer adjacent the first inner spacer, and a first outer spacer adjacent the first low-K layer, and
   wherein the inactive gate includes only: a second gate stack, a second inner spacer adjacent the second gate stack, and a second low-dielectric constant (low-K) layer adjacent at least a portion of the second inner spacer.

3. The structure of claim 1, wherein the dielectric includes an oxide.

4. The structure of claim 1, wherein the dielectric is an interlayer dielectric (ILD).

5. The structure of claim 1, wherein the trench isolation includes an upper portion contiguous with an insulator layer of the FDSOI substrate.

6. The structure of claim 1, wherein the dielectric abuts an end of at least one of the first liner and the second liner in the trench isolation region.

7. The structure of claim 1, wherein the inactive gate is positioned on a plateau of the trench isolation, and the dielectric is in direct contact with the inactive gate, a side of the plateau of the trench isolation and an upper surface of the trench isolation adjacent the plateau.

8. The structure of claim 1, wherein the first liner includes a tensile liner, and the second liner includes a compressive liner.

9. The structure of claim 8, wherein the trench isolation includes an upper portion contiguous with an insulator layer of the FDSOI substrate.

10. A fully depleted semiconductor-on-insulator (FDSOI) structure, comprising:

an FDSOI substrate;

a first transistor including a first active gate over a semiconductor-on-insulator (SOI) layer of the FDSOI substrate;

a second transistor including a second active gate over the SOI layer of the FDSOI substrate;

a first liner extending over the first transistor;

a second liner extending over the second transistor;

a trench isolation region electrically isolating the first transistor from the second transistor, the trench isolation region including a trench isolation extending into the FDSOI substrate and an inactive gate over a plateau of the trench isolation; and an interlayer dielectric (ILD) extending over the inactive gate and in direct contact with an upper surface of the trench isolation adjacent the plateau of the trench isolation, wherein the dielectric is void-free and an end of each of the first and second liners does not extend over the trench isolation in the trench isolation region.

11. The FDSOI structure of claim 10, wherein each active gate includes a first gate stack, a first inner spacer adjacent the first gate stack, a first low-dielectric constant (low-K) layer adjacent the first inner spacer, and a first outer spacer adjacent the first low-K layer, and wherein the inactive gate includes only: a second gate stack, a second inner spacer adjacent the second gate stack, and a second low-dielectric constant (low-K) layer adjacent a portion of the second inner spacer.

12. The FDSOI structure of claim 10, wherein the ILD includes an oxide.

13. The FDSOI structure of claim 10, wherein the trench isolation includes an upper portion contiguous with an insulator layer of the FDSOI substrate.

14. The FDSOI structure of claim 10, wherein the ILD abuts an end of at least one of the first liner and the second liner.

15. The FDSOI structure of claim 10, wherein the ILD is in direct contact with the inactive gate and a side of the plateau of the trench isolation.

* * * * *

UNITED STATES PATENT AND TRADEMARK OFFICE
CERTIFICATE OF CORRECTION

PATENT NO. : 11,171,036 B2
APPLICATION NO. : 16/596814
DATED : November 9, 2021
INVENTOR(S) : Yongjun Shi et al.

It is certified that error appears in the above-identified patent and that said Letters Patent is hereby corrected as shown below:

On the Title Page

Item (72), Line 10, the Inventors:
"Yongjun Shi, Clifton Park, NY (US)
Wei Hong, Clifton Park, NY (US)
Chun Yu Hong, Clifton Park, NY (US)
Halting Wang, Clifton Park, NY (US)
Liu Jiang, Clifton Park, NY (US)"

Should read:
"Yongjun Shi, Clifton Park, NY (US)
Wei Hong, Clifton Park, NY (US)
Chun Yu Hong, Clifton Park, NY (US)
Haiting Wang, Clifton Park, NY (US)
Liu Jiang, Clifton Park, NY (US)"

Signed and Sealed this
Thirty-first Day of May, 2022

Katherine Kelly Vidal
*Director of the United States Patent and Trademark Office*